United States Patent
Chiang et al.

(10) Patent No.: US 10,818,488 B2
(45) Date of Patent: Oct. 27, 2020

(54) WAFER STRUCTURE AND TRIMMING METHOD THEREOF

(71) Applicant: Taiwan Semiconductor Manufacturing Co., Ltd., Hsinchu (TW)

(72) Inventors: Hao-Ning Chiang, Tainan (TW); Ming-Te Chuang, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 100 days.

(21) Appl. No.: 16/170,039

(22) Filed: Oct. 25, 2018

(65) Prior Publication Data

US 2019/0148130 A1    May 16, 2019

Related U.S. Application Data

(60) Provisional application No. 62/584,924, filed on Nov. 13, 2017.

(51) Int. Cl.
| | |
|---|---|
| *H01L 21/304* | (2006.01) |
| *H01L 21/02* | (2006.01) |
| *H01L 23/544* | (2006.01) |
| *H01L 21/306* | (2006.01) |
| *H01L 23/00* | (2006.01) |

(52) U.S. Cl.
CPC .. *H01L 21/02021* (2013.01); *H01L 21/02019* (2013.01); *H01L 21/304* (2013.01); *H01L 21/3043* (2013.01); *H01L 21/30604* (2013.01); *H01L 21/30625* (2013.01); *H01L 23/544* (2013.01); *H01L 23/562* (2013.01); *H01L 2223/54426* (2013.01)

(58) Field of Classification Search
CPC .............. H01L 21/304; H01L 21/3043; H01L 21/30604; H01L 21/30625; H01L 21/02021; H01L 21/02019
See application file for complete search history.

(56) References Cited

U.S. PATENT DOCUMENTS

| | | | |
|---|---|---|---|
| 5,937,312 A * | 8/1999 | Iyer | ...................... H01L 21/3226 438/459 |
| 10,468,400 B2 * | 11/2019 | Kang | ...................... H01L 24/94 |
| 2007/0072393 A1 | 3/2007 | Aspar et al. | |
| 2008/0044984 A1 * | 2/2008 | Hsieh | ................. H01L 27/14687 438/459 |
| 2008/0179710 A1 | 7/2008 | Yip et al. | |
| 2011/0097874 A1 | 4/2011 | Broekaart et al. | |

OTHER PUBLICATIONS

"Office Action of Taiwan Counterpart Application", dated Aug. 7, 2019, p. 1-p. 8.

* cited by examiner

*Primary Examiner* — Douglas M Menz
(74) *Attorney, Agent, or Firm* — JCIPRNET (57) ABSTRACT

A wafer structure and a trimming method thereof are provided. The trimming method includes the following steps. A first wafer having a first surface and a second surface opposite to the first surface is provided. A first pre-trimming mark is formed on the first surface of the first wafer, wherein forming the first pre-trimming mark includes forming a plurality of recesses arranged as a path along a periphery of the first wafer. The first wafer is trimmed on the first pre-trimming mark and along the path of the first pre-trimming mark to remove a portion of the first wafer and form a trimmed edge having first regions thereon.

18 Claims, 9 Drawing Sheets

WAFER STRUCTURE AND TRIMMING METHOD THEREOF

CROSS-REFERENCE TO RELATED APPLICATION

This application claims the priority benefits of U.S. provisional application Ser. No. 62/584,924, filed on Nov. 13, 2017. The entirety of the above-mentioned patent application is hereby incorporated by reference herein and made a part of this specification.

BACKGROUND

In recent years, owing to the need in miniaturizing the semiconductor chips, the requirements of wafer thinning process become more severe in semiconductor manufacturing process. Generally, during the wafer thinning process, the grinding process performed on the backside of the semiconductor wafer may cause the wafer edge to be damaged. Subsequently, an edge trimming process may be performed to remove the outer edge of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
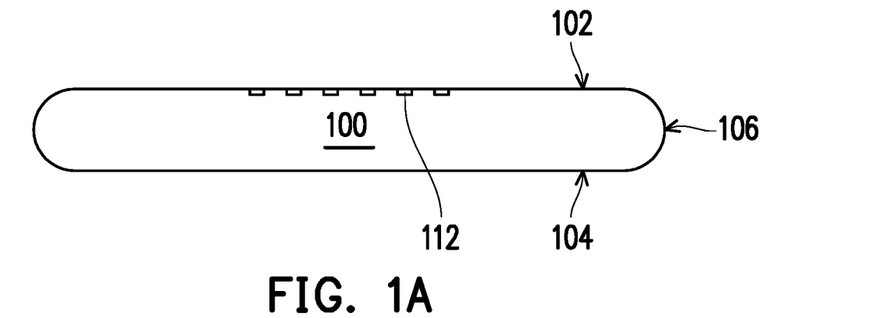
FIG. 1A through FIG. 1H illustrate schematic cross-sectional views of a trimming method of a stacked wafer structure, in accordance with some embodiments of the present disclosure.

FIG. 1A through FIG. 1H illustrate schematic cross-sectional views of a trimming method of a stacked wafer structure, in accordance with some embodiments of the present disclosure. Referring to FIG. 1A, a first wafer 100 is provided. In some embodiments, the first wafer 100 has a first surface 102, a second surface 104 opposite to the first surface 102, and an edge 106 connecting between the first surface 102 and the second surface 104. For example, a side where the first surface 102 is located may be referred to the front side of the first wafer 100, and the opposite side where the second surface 104 is located may be referred to the backside of the first wafer 100. The first wafer 100 may be of any appropriate size and shape. In some embodiments, the first wafer 100 is a substantially circular wafer. The edge 106 in FIG. 1A is illustrated as curve shaped or a rounded edge. In other embodiments, the first wafer 100 may have a chamfered edge or a beveled edge.

In some embodiments, the first wafer 100 may be a semiconductor wafer such as a silicon bulk wafer or a gallium arsenide wafer. In some embodiments, the first wafer 100 may include, for example, silicon, strained silicon, silicon alloy, silicon carbide, silicon-germanium, silicon-germanium carbide, germanium, a germanium alloy, germanium-arsenic, indium-arsenic, group III-V semiconductors. In some embodiments, the first wafer 100 is a device wafer. In some embodiments, the first wafer 100 includes a plurality of devices 112 may be formed at the first surface 102 of the first wafer 100. The devices 112 may be, for example, light sensing devices or image sensors capable of converting light to electrical signals formed and located at the front side of the first wafer 100. In certain embodiments, the devices 112 may include, for example, photo diodes (PD), photo transistors, or a combination thereof. In some embodiments, the devices 112 may include, for example, CMOS image sensors (CIS) or charge-coupled device (CCD) sensors. The devices 112 are located relatively distanced from the edge 106 (the periphery of the first wafer 100) such that the following trimming processes may be carried out without damaging the devices 112. In some embodiments, additional semiconductor devices or electrical components with different functions or integrated circuits may also be included in the first wafer 100. In some embodiments, interconnect structures (not illustrated) may be formed over the first wafer 100 and be electrically coupled with the devices 112 and/or other electrical components. The scope of the disclosure is not limited to the embodiments or drawings described therein.

Figure 2A:
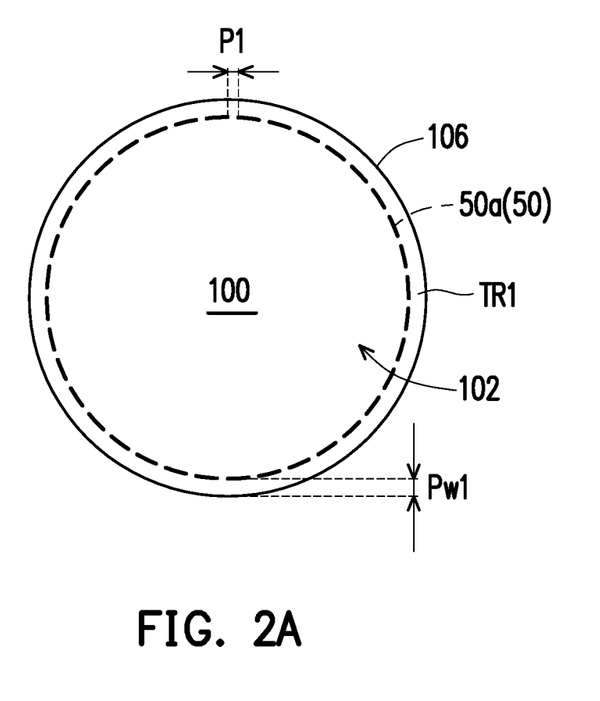
FIG. 2A illustrates a schematic top view of a first wafer after forming a first pre-trimming mark, in accordance with some embodiments of the present disclosure.
Figure 2B:
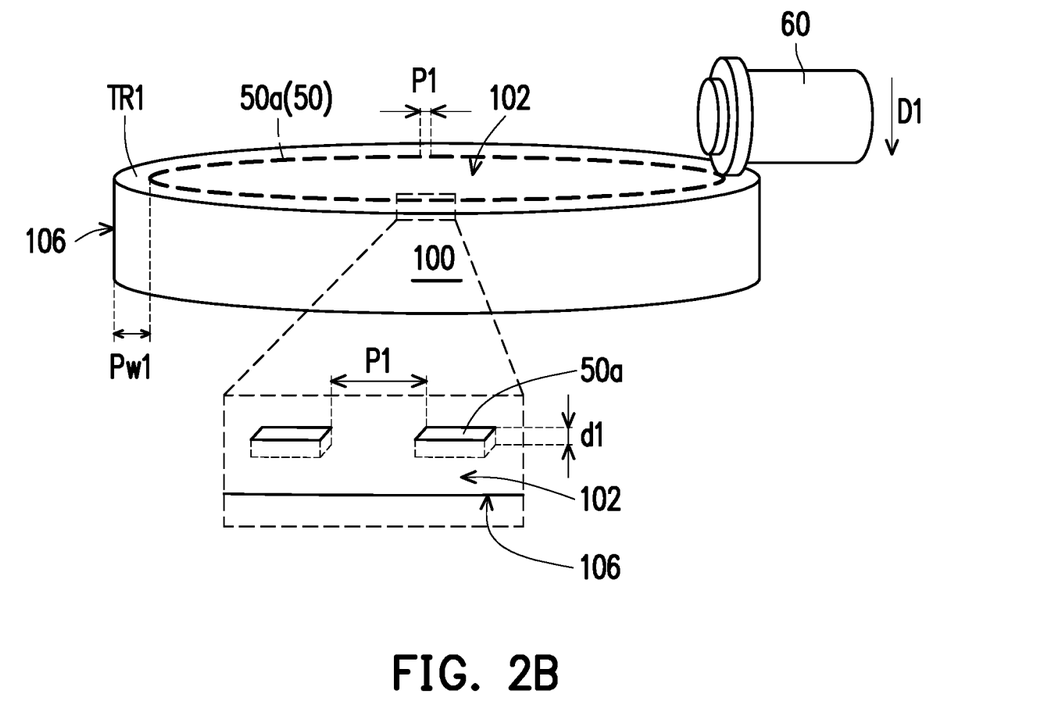
FIG. 2B and FIG. 2C illustrate schematic perspective views of a marking-trimming process of a first wafer, in accordance with some embodiments.
Figure 2C:
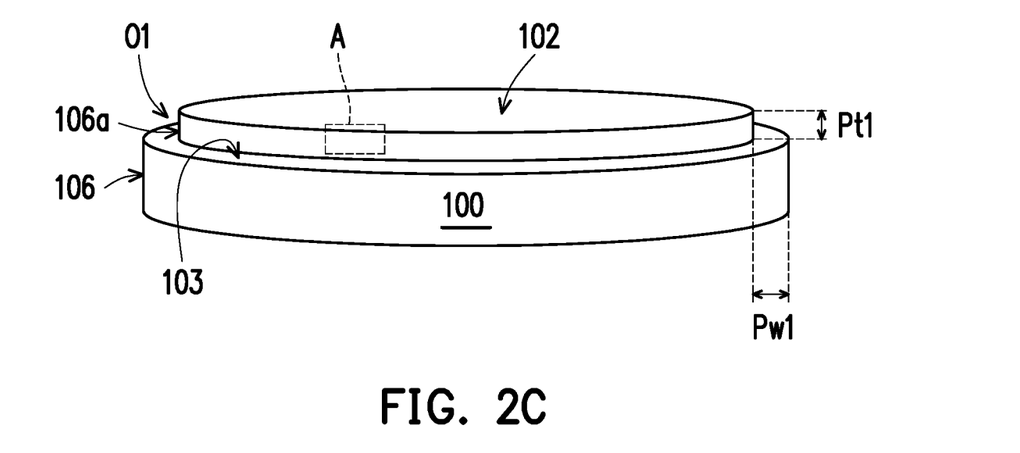
Figure 2D:
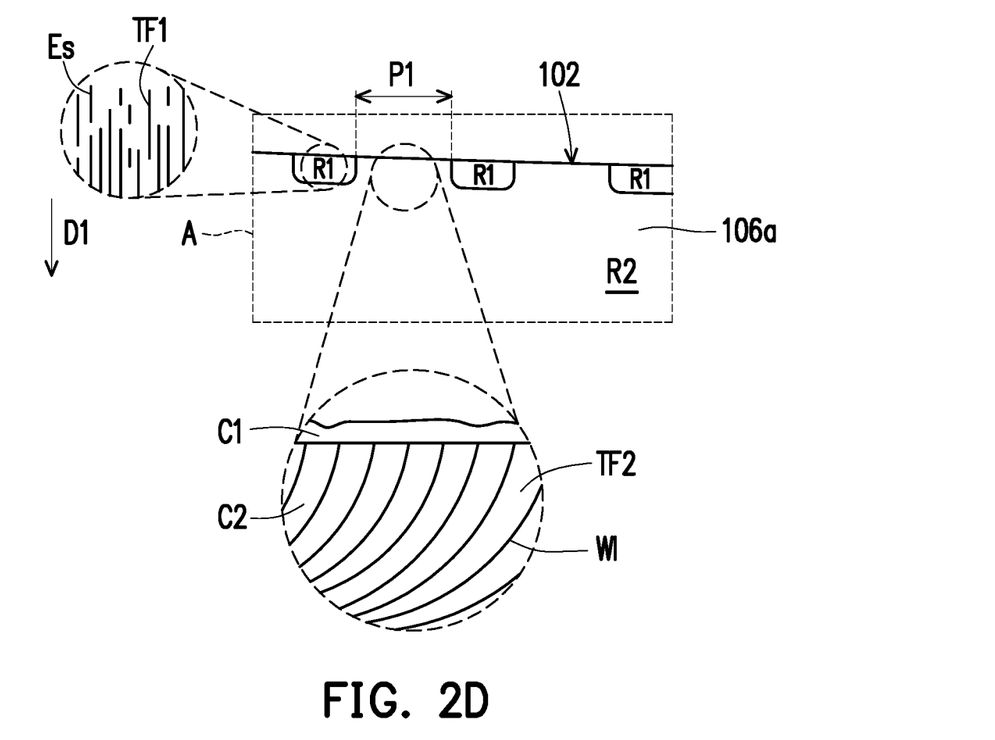
FIG. 2D illustrates a schematic enlarged cross-sectional view of an edge surface in the area A shown in FIG. 2C, in accordance with some embodiments of the present disclosure.

After providing the first wafer 100, a first marking-trimming step is performed. FIG. 2A illustrates a schematic top view of a first wafer after forming a first pre-trimming mark, in accordance with some embodiments of the present disclosure. FIG. 2B and FIG. 2C illustrate schematic perspective views of a marking-trimming process of a first wafer, in accordance with some embodiments of the present disclosure. FIG. 2D illustrates a schematic enlarged cross-sectional view of an edge surface in the area A shown in FIG. 2C, in accordance with some embodiments of the present disclosure. Referring to FIG. 2A through FIG. 2C, in some embodiments, the first wafer 100 may be a round-shaped wafer and a first pre-trimming mark 50 is formed on the first surface 102 of the first wafer 100 to define an annular ring TR1. In certain embodiments, the annular ring TR1 defined between the first pre-trimming mark 50 and the edge 106 of the first wafer 100 (i.e. the periphery of the first wafer 100) has a first width Pw1. In some embodiments, the first pre-trimming mark 50 may be formed as a discontinuous pattern or an intermittent pattern on the first surface 102. In some embodiments, the first pre-trimming mark 50 includes a plurality of recesses 50a, and the recesses 50a are individual narrow trenches separate from one another. For example, the recesses 50a is arranged as a circular path along the periphery of the first wafer 100 to form the first pre-trimming mark 50.

In some embodiments, the recesses 50a are formed by etching, for example, wet etching, or dry etching. In certain embodiments, the recesses 50a are formed by laser marking or other suitable marking process. Each recess 50a may include a marking depth d1 relative to a reference plane corresponding to the first surface 102 of the first wafer 100. The marking depth d1 of each recess 50a shown in FIG. 2B may range from 10 μm to 150 μm, preferably from 80 μm to 120 μm. It should be noted that the marking depth d1 may be varied depending on the trimming depth of the wafer in the subsequent trimming step. It is appreciated that the number of the recesses 50a, the shape or the size of the recesses 50a, and the arrangement of the recesses 50a may be modified according to the design requirements of the product. In some embodiments, the intermittent pattern of the first pre-trimming mark 50 may include individual recesses 50a separated with one another and spaced by a fixed pitch. In some embodiments, any two most adjacent recesses 50a are spaced by a pitch P1. For example, the pitch P1 between the two most adjacent recesses 50a may range from 5 μm to 100 μm, preferably from 8 μm to 40 μm. In some embodiments, a sum of the pitches P1 along the circular path may be approximately half of a total length of the circular path. For example, the recesses 50a may be evenly distributed on the first surface 102 as a circular path along the periphery of the first wafer 100. It should be noted that the pitch P1 may be modified according to the dimension of the wafer and the design requirements. In some other embodiments, a ratio of the sum of the pitches P1 along the circular path to the total length of the circular path of the first pre-trimming mark 50 ranges from 30% to 80%. In alternative embodiments, the pattern of the first pre-trimming mark 50 may be sporadic. In other embodiments, the pattern includes individual recesses 50a separated with one another and spaced with various pitches.

Figure 1B:
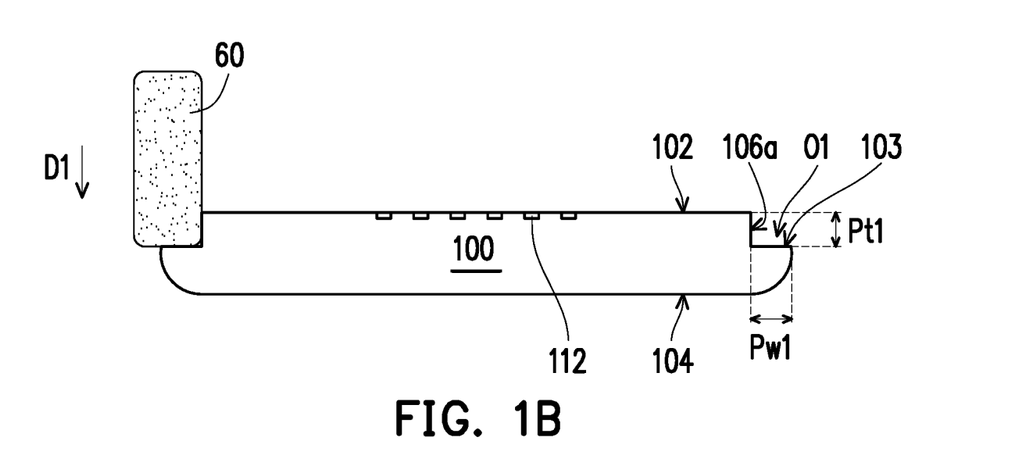

After forming the first pre-trimming mark 50, a first trimming step is performed. The processes illustrated in FIG. 2A through FIG. 2C may be referred to as the first marking-trimming step. For example, the annular ring TR1 around the periphery of the first wafer 100 is removed from the first wafer 100 by performing the first trimming step along the first pre-trimming mark 50 as shown in FIGS. 2B-2C and FIG. 1B. In some embodiments, the first trimming step includes cutting or trimming off a portion of the first wafer 100 by mechanical machining from the first surface 102 vertically downward (i.e. towards the second surface 104 but not cutting through) along the thickness direction D1 to form the trimmed edge 106a near the periphery of the first wafer 100 as shown in FIG. 2C and FIG. 1B. In some embodiments, the first trimming step is performed by a trimming tool 60 cutting substantially vertically or slantedly into the first wafer 100 to a trimming depth Pt1. In certain embodiments, during the first trimming step, the first wafer 100 is cut right on the first pre-trimming mark 50 and the first pre-trimming mark 50 is cut through, leading to a trimming depth Pt1 larger than the marking depth d1 of the recesses 50a of the first pre-trimming mark 50. In some embodiments, the trimming tool includes a scribing wheel or a trimming blade wheel. Alternatively, the first trimming step is performed through any other suitable tools capable of mechanically cutting away the material of the wafer structure, and the scope of the disclosure is not limited thereto. For example, during the first trimming step, the trimming tool 60 rotates and moves along the circular path of the first pre-trimming mark 50 for wafer-edge trimming. In some embodiments, as the first wafer is cut or trimmed on the first pre-trimming mark 50 and along the path of the first pre-trimming mark 50, the path of the first pre-trimming mark 50 (e.g. the circular path as shown in FIG. 2B) functions as the trimming path. Since the trimming tool 60 is moved along the circular path formed by the recesses 50a, the direct contact between the trimming tool 60 and the first wafer 100 is reduced along the trimming path, thereby reducing localized stress concentration at the first surface 102 and easing chip cracking induced by the stress. Accordingly, the production yield is significantly improved. In addition, the operation efficiency of trimming is improved and the service life of the trimming tool 60 is lengthened as the shorter cutting distance or path reduces the damage of the trimming tool 60.

In some embodiments, after the first trimming step, the annular ring TR1 is removed to form a ring-shaped opening O1 at the periphery of the first wafer 100 as shown in FIG. 2C. During the first marking-trimming step, the removed annular ring TR1 may have the first width Pw1 (as defined by the first pre-trimming mark 50) and the thickness Pt1 (the trimming depth Pt1). Referring to FIG. 1B, from a cross-sectional view, the ring-shaped opening O1 looks like L-shaped and the sidewall of the ring-shaped opening O1 is the trimmed edge 106a. In some embodiments, the trimmed edge 106a is substantially perpendicular to the first surface 102. In some embodiments, the trimmed edge 106a is slant to the first surface 102.

In some embodiments, the first thickness Pt1 (i.e. the trimming depth Pt1) is measured from the bottom surface 103 (shown in FIG. 1B) of the opening O1 to a reference plane extending from the first surface 102. In some embodiments, the first width Pw1 is measured from the trimmed edge 106a to a reference plane extending from the edge 106. In some embodiments, the first wafer 100 is a silicon wafer having a diameter of about 12-inch (about 300 mm). In such embodiments, the trimming depth Pt1 ranges from about 50 microns to about 150 microns or is about 100 microns. In such embodiments, the first width Pw1 ranges from about 0.8 mm to about 1.5 mm or is about 1.2 mm. It is appreciated that the first thickness Pt1 and the first width Pw1 may be modified depending on the dimension of the wafer and the design requirements of the product, which is not limited thereto.

Referring to FIG. 2D, after performing the first marking-trimming step, the sidewall surface of the trimmed edge 106a (e.g. the area A indicated in FIG. 2C and FIG. 2D) may have a plurality of first regions R1 surrounding by a second region R2. In some embodiments, the first regions R1 are formed from the recesses 50a (FIG. 2B) cutting through during the trimming step. That is, the first regions R1 are cut-through recesses. The individual first regions R1 may be separated with one another and are spaced from one another by the second region R2 surrounding them. In some embodiments, the texture feature TF1 of the first regions R1 is different from the texture feature TF2 of the second region R2. In some embodiments, the first region R1 includes etching streaks as the texture feature TF1 when recesses 50a are formed by etching. In some embodiments, the first region R1 includes laser marking streaks as the texture feature TF1 when the recesses 50a are formed by laser marking. For example, the etching streaks Es may be presented as fine straight lines extending in the thickness direction D1 in the first regions R1 as shown in the enlarged view in the upper part of FIG. 2D. In some embodiments, as shown in the enlarged view in the lower part of FIG. 2D, the texture feature TF2 of the second region R2 includes fracture texture presented in the second region R2 as a main crack portion C1 and a median crack portion C2 below the main crack portion C1. For example, a thickness of the main crack portion C1 may be smaller than a thickness of the median crack portion C2. As the pre-trimming mark is formed prior to the trimming step, a smaller main crack portion C1 is formed due to the less localized stress concentration. It is appreciated that the thickness and the profile of the median crack portion C2 depends on the types of the trimming tool used. In some embodiments, the microscopic fractures W1 (also known as Wallner lines) may be formed on the surface in the median crack portion C2 of the second region R2, and the microscopic fractures may exhibit as evenly distributed and substantially parallel curves extending with respect to the thickness direction without irregular lateral cracks.

Figure 1C:
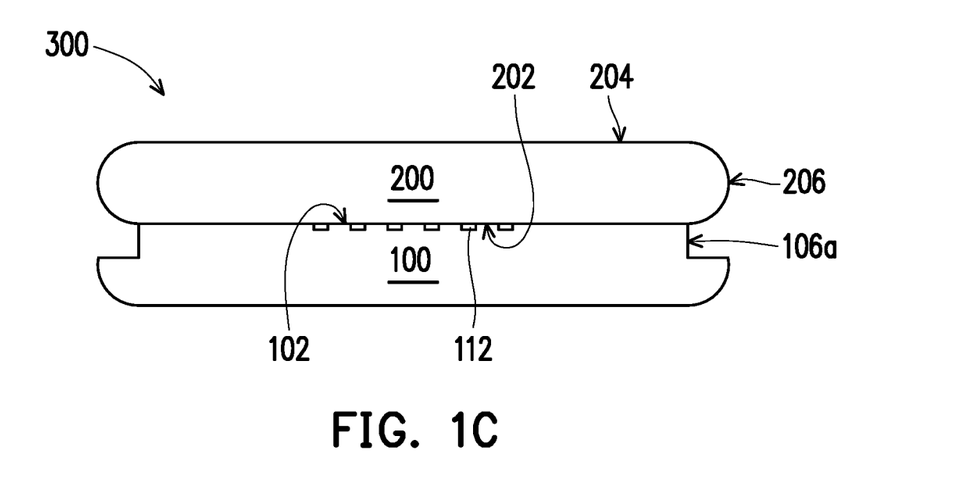

Referring to FIG. 1C, a second wafer 200 having a top surface 202, a bottom surface 204 opposite to the top surface 202 and an edge 206 connected between the top surface 202 and the bottom surface 204 is provided. For example, the second wafer 200 is a semiconductor wafer and functions as a carrier wafer herein. In some embodiments, the second wafer 200 may include, for example, silicon, strained silicon, silicon alloy, silicon carbide, silicon-germanium, silicon-germanium carbide, germanium, a germanium alloy, germanium-arsenic, indium-arsenic, group III-V semiconductors. In some embodiments, the second wafer 200 includes glass or ceramic materials. After performing the first marking-trimming step, the first wafer 100 and the second wafer 200 are bonded to each other to form a stacked wafer structure 300. In some embodiments, the first wafer 100 and the second wafer 200 have the same diameter. In other embodiments, the first wafer 100 and the second wafer 200 may have different diameters. The dimension of the first wafer 100 and the second wafer 200 may depend on the design requirement and construe no limitation in the disclosure. When bonding the first wafer 100 and the second wafer 200, the molecular bonding technique may be employed. For example, bringing the first surface 102 of the first wafer 100 and the top surface 202 of the second wafer 200 into direct contact, and the first wafer 100 and the second wafer 200 are bonded through Van der Waals force without using a specific bonding material or an adhesive.

It should be noted that the molecular bonding technique may require the surfaces of the first wafer 100 and the second wafer 200 to be bonded are smooth and also free from particles or contamination. Before bonding the first wafer 100 and the second wafer 200, the first surface 102 of the first wafer 100 and/or the top surface 202 of the second wafer 200 may be treated by a cleaning process to remove particles thereon. After cleaning, the first wafer 100 and the second wafer 200 are placed sufficiently close together for contact to be initiated. Under such circumstances, a force of attraction between the first surface 102 of the first wafer 100 and the top surface 202 of the second wafer 200 is high enough to cause molecular bonding induced by the Van der Waals force.

In some embodiments, in FIG. 1C, after bonding the first wafer 100 and the second wafer 200, an annealing process may be performed to strengthen the bonding between the first wafer 100 and the second wafer 200. The temperature of the annealing process may depend on the design requirement. For example, the higher the temperature of the annealing process, the greater the resulting bonding strength. In other embodiments in which the electrical components are distributed in the first wafer 100, the temperature of the annealing process is limited to relatively low so as not to damage the electrical components. In some other embodiments, the first wafer 100 and the second wafer 200 may be bonded though a bonding layer formed on the bonding interface of the first wafer 100 or on the second wafer 200 before bringing the wafers into contact.

Figure 1D:
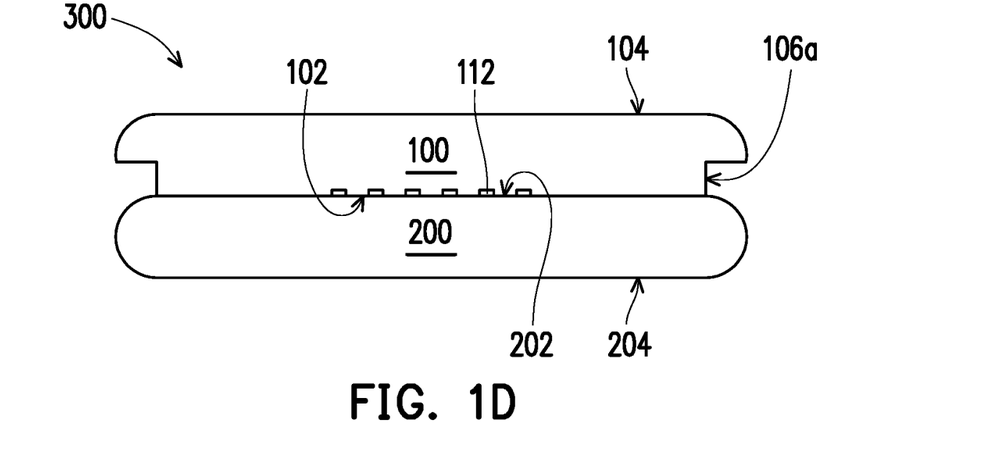

Referring to FIG. 1D, the stacked wafer structure 300 is flipped upside down. After flipping, the second surface 104 of the first wafer 100 faces upwardly and the first wafer 100 is carried by the second wafer 200 for subsequent processes. The flipping process may be optional in some embodiments.

Figure 1E:
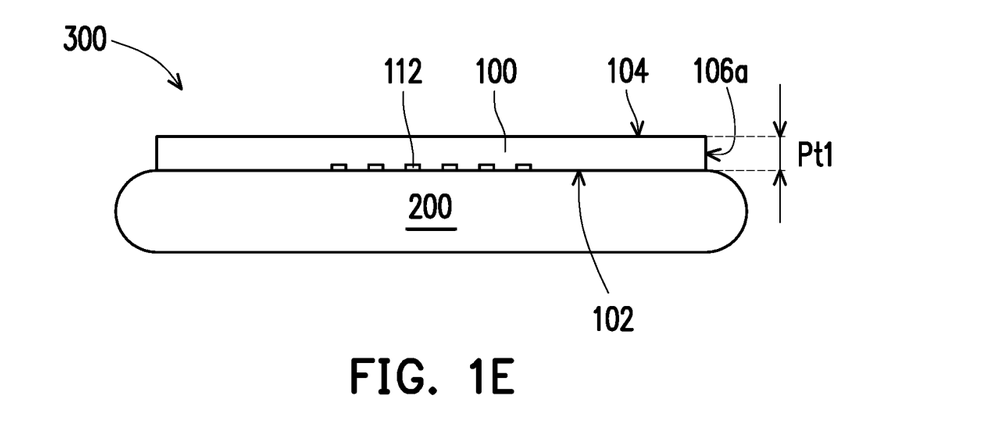

Referring to FIG. 1E, the first wafer 100 is thinned (i.e. the thickness of the first wafer 100 is reduced) by performing a mechanical machining process, and the mechanical machining process includes, for example, a grinding process, a chemical mechanical polishing (CMP) process, or other suitable polishing process. In some embodiments, the first wafer 100 is thinned from the second surface 104 downward towards the first surface 102. For example, during performing the thinning process, the stacked wafer structure 300 is held by a wafer holder (not illustrated). In some embodiments, the first wafer 100 may be thinned until the remained thickness of the first wafer 100 almost equal to or slightly less than the first thickness Pt1. Since the edge 106 of the first wafer 100 is trimmed before performing the wafer thinning process such that an edge-cracking issue due to sharp edges of the thinned wafer can be eliminated.

Figure 1F:
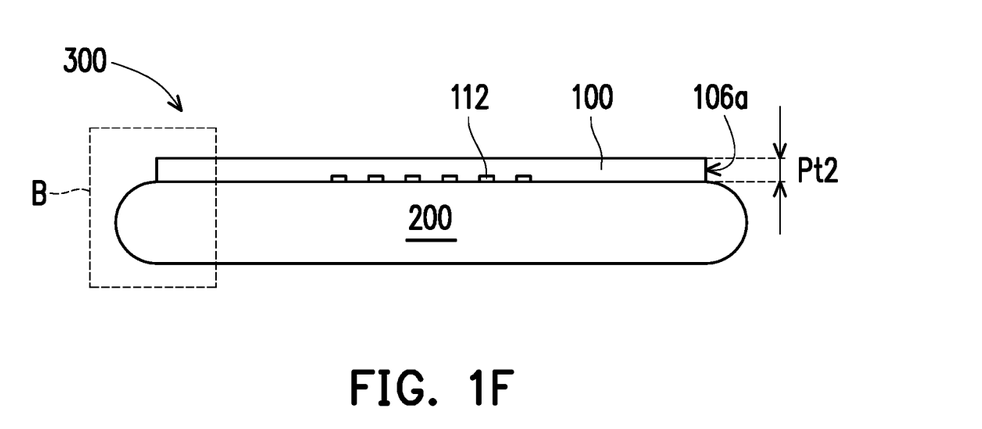

Referring to FIG. 1F, in some embodiments, the wafer thinning process further comprises an etching process. In certain embodiments, the first wafer 100 is further thinned by performing, for example, a wet etching process. In some embodiments, the wet etching process employs hydrofluoric acid/nitric acid/acetic acid (HNA) as the etchant. In some other embodiments, the first wafer 100 is further thinned by performing a dry etching process, and the dry etching process may include a reactive ion etching (RIE) process. The etching process at this stage further thins the first wafer 100 to a desired thickness Pt2. For example, the thickness Pt2 of the first wafer 10 ranges from about 3.8 microns to about 4.3 microns. In some embodiments, the wafer thinning process includes one or more thin-down processes. The wafer thinning process is performed to reduce the thickness of the first wafer 100 on which the devices 112 (e.g. image sensors) or other electrical components are formed until it reaches the desired thickness Pt2. For example, after performing the thinning processes shown in FIG. 1E and FIG. 1F, the thickness Pt2 of the first wafer 100 is small enough such that light can reach the devices 112 or the other electrical components.

Figure 3A:
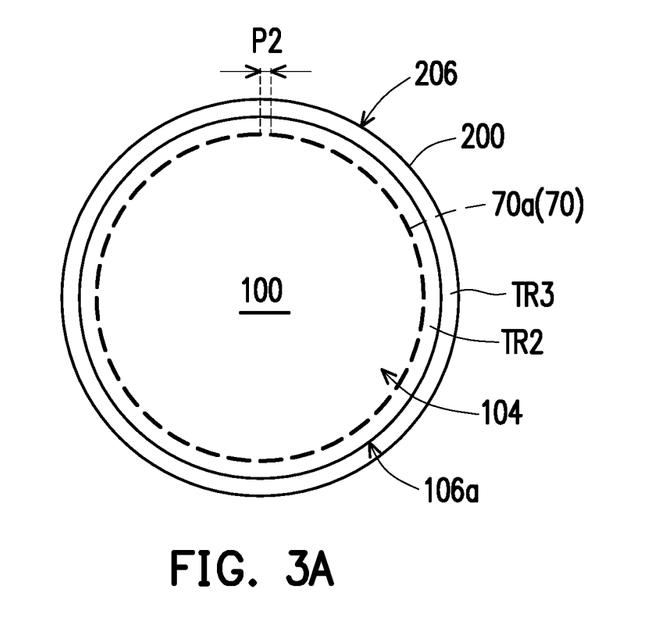
FIG. 3A illustrates a schematic top view of a stacked wafer structure after forming a second pre-trimming mark, in accordance with some embodiments of the present disclosure.
Figure 3B:
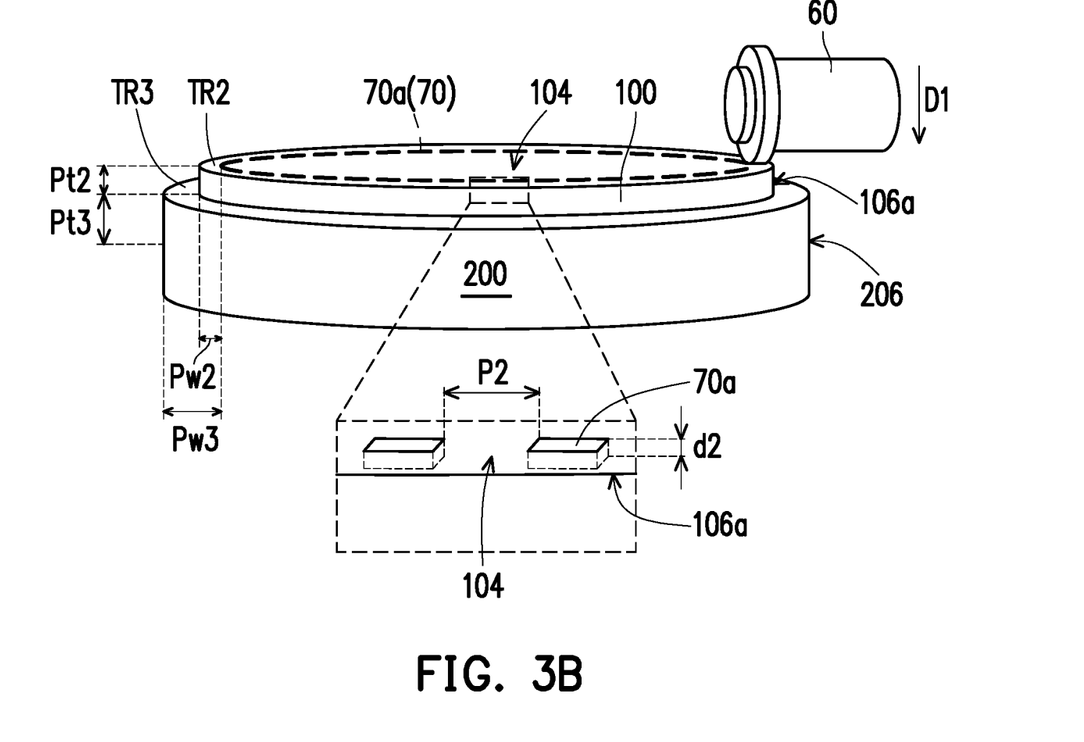
FIG. 3B and FIG. 3C illustrate schematic perspective views of a marking-trimming process of a first wafer and a second wafer, in accordance with some embodiments of the present disclosure.
Figure 3C:
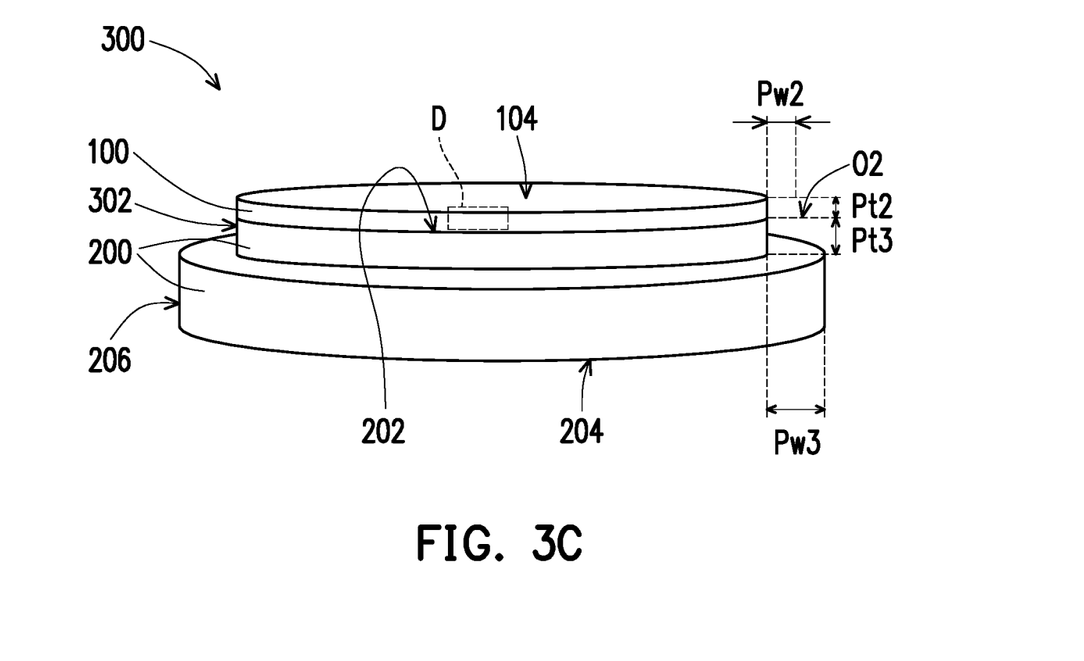
Figure 3D:
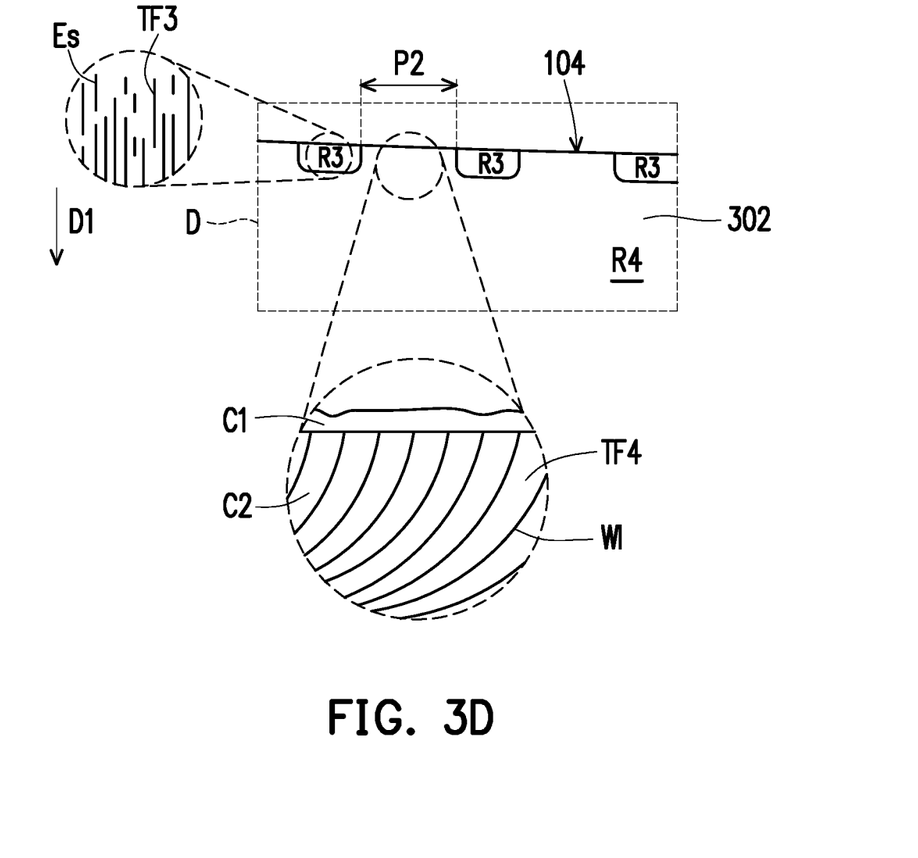
FIG. 3D illustrates a schematic enlarged cross-sectional view of an edge surface in the area D shown in FIG. 3C, in accordance with some embodiments of the present disclosure.

After thinning the first wafer 100, a second marking-trimming step is performed the thinned first wafer 100 with a thickness Pt2. FIG. 3A illustrates a schematic top view of a stacked wafer structure after forming a second pre-trimming mark, in accordance with some embodiments of the present disclosure. FIG. 3B and FIG. 3C illustrate schematic perspective views of a marking-trimming process of a first wafer and a second wafer, in accordance with some embodiments of the present disclosure. FIG. 3D illustrates a schematic enlarged cross-sectional view of an edge surface in the area D shown in FIG. 3C, in accordance with some embodiments of the present disclosure. Referring to FIG. 3A through FIG. 3C, after thinning the first wafer 100, a second pre-trimming mark 70 is formed on the second surface 104 of the thinned first wafer 100. In certain embodiments, the second pre-trimming mark 70 defines the to-be-removed edge portion in the subsequently trimming step, and the to-be-removed portion includes an annular ring TR2 and an annular ring TR3 in FIGS. 3A-3B. In certain embodiments, the annular ring TR2 defined between the second pre-trimming mark 70 and the trimmed edge 106a of the first wafer 100 (i.e. the periphery of the first wafer 100) has a second width Pw2. In certain embodiments, the annular ring TR3 defined between the second pre-trimming mark 70 and the edge 206 of the second wafer 200 (i.e. the periphery of the second wafer 200) has a third width Pw3. In some embodiments, the second pre-trimming mark 70 may be formed as a discontinuous pattern or an intermittent pattern on the second surface 104. In some embodiments, the second pre-trimming mark 70 includes a plurality of recesses 70a, and the recesses 70a are individual narrow trenches separate from one another. For example, the recesses 70a is arranged as a circular path along the trimmed edge 106a to form the second pre-trimming mark 70. In some embodiments, forming the recesses 70a may use the similar process as forming the recesses 50a and the detailed descriptions are omitted herein.

Each recess 70a may include a marking depth d2 relative to a reference plane corresponding to the second surface 104 of the thinned first wafer 100. The marking depth d2 of each recess 70a may range from 1 μm to 35 μm, preferably, from 15 μm to 30 μm. In some embodiments, the marking depth d2 is smaller than the thickness Pt2 of the thinned first wafer 100. It is appreciated that the number of the recesses 70a, the shape or the size of the recesses 70a, and the arrangement of the recesses 70a may be modified according to the design requirements of the product. In some embodiments, the intermittent pattern of the second pre-trimming mark 70 may include individual recesses 70a separated with one another and spaced by a fixed pitch. In some embodiments, any two most adjacent recesses 70a are spaced by a pitch P2. For example, the pitch P2 between the two most adjacent recesses 70a may range from 5 μm to 100 μm, preferably from 20 μm to 40 μm. In some embodiments, a sum of the pitches P2 along the circular path may be approximately half of a total length of the circular path. In other words, the recesses 70a may be evenly distributed on the second surface 104 as a circular path along the periphery of the first wafer 100 after performing the first marking-trimming step. In some other embodiments, a ratio of the sum of the pitches P2 along the circular path to the total length of the circular path of the second pre-trimming mark 70 ranges from 30% to 80%. It should be noted that the pitch P2 may be modified according to the dimension of the wafer and the design requirements. In alternative embodiments, the pattern of the second pre-trimming mark 70 may be sporadic. In other embodiments, the pattern includes individual recesses 70a separated with one another and spaced with various pitches.

After forming the second pre-trimming mark 70, a second trimming step is performed to the stacked wafer structure 300. The processes illustrated in FIG. 3A through FIG. 3C may be referred to as the second marking-trimming step. For example, during the second trimming step, the annular ring TR2 around the periphery of the first wafer 100 and the annular ring TR3 of the second wafer 200 located under the annular ring TR2 of the first wafer 100 are removed as the stacked wafer structure 300 is cut or trimmed right on and along the second pre-trimming mark 70. For example, the second trimming step is performed from the second surface 104 of the first wafer 100 downward to the second wafer 200 along the thickness direction D1 to form the trimmed edge 302 at the periphery of the stacked wafer structure 300. In some embodiments, the second trimming step is performed by the trimming tool 60 cutting substantially vertically or slantedly into the stacked wafer structure 300 to a trimming depth (i.e. Pt2+Pt3). That is, during the second trimming step, the thinned first wafer 100 with the thickness Pt2 is cut through and the second wafer 200 is cut or trimmed to the depth Pt3. In some embodiments, the second trimming step is carried out by mechanical machining which is similar with the first trimming step, and the detailed descriptions are omitted herein.

Figure 1G:
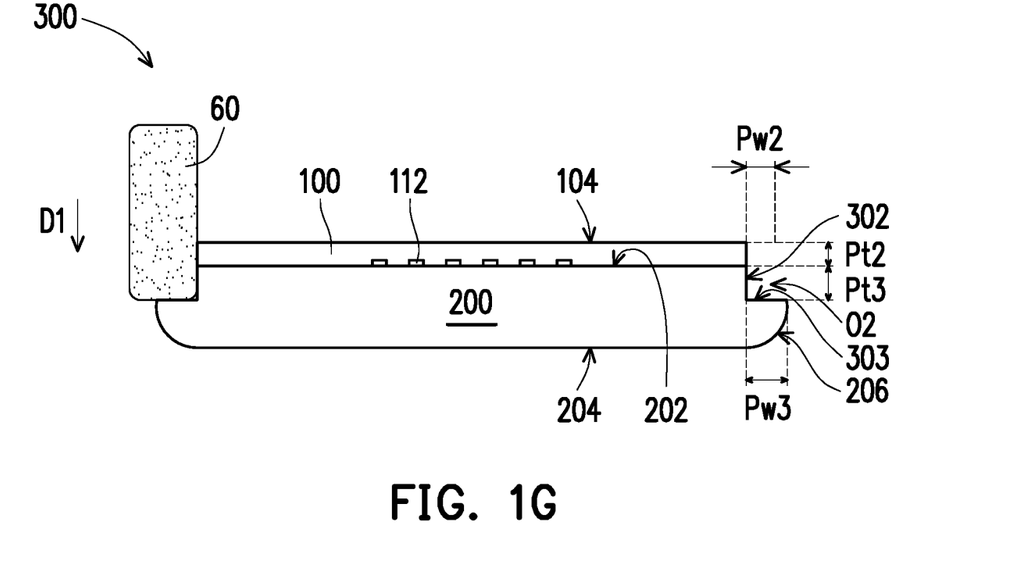

During the second marking-trimming step, the removed annular rings TR2 may have the second width Pw2 (as defined by the second pre-trimming mark 70) and the thickness Pt2 (the trimming depth Pt2), and the removed annular ring TR3 may have the third width Pw3 (also defined by the second pre-trimming mark 70) and the thickness Pt3 (the trimming depths Pt3). In some embodiments, after removing the annular ring TR2 of the first wafer 100 and the annular ring TR3 of the second wafer 200, a ring-shaped opening O2 is formed at the periphery of the stacked wafer structure 300 as shown in FIG. 3C. Referring to FIG. 1G, from a cross-sectional view, the ring-shaped opening O2 looks like L-shaped and the sidewall of the ring-shaped opening O2 is the trimmed edge 302. In some embodiments, the trimmed edge 302 is substantially perpendicular to the second surface 104 of the first wafer 100. In some other embodiments, the trimmed edge 302 of the stacked wafer structure 300 is slant to the second surface 104. The depth of the opening O2 is the total thickness of the second thickness Pt2 and the third thickness Pt3. Since the first wafer 100 has been thinned, the first wafer 100 in the stacked wafer structure 300 may be trimmed over the second thickness Pt2 which is less than the first thickness Pt1 during the first trimming step.

In some embodiments, the second thickness Pt2 (i.e. the trimming depth Pt2) is measured from a reference plane extending from the top surface 202 of the second wafer 200 to a reference plane extending from the second surface 104 of the first wafer 100. In some embodiments, the second width Pw2 is measured from a reference plane extending from the trimmed edge 106a to a reference plane extending from the trimmed edge 302. The third thickness Pt3 (i.e. the trimming depth Pt3) is measured from the bottom surface 303 (shown in FIG. 1G) of the opening O2 to a reference plane extending from the top surface 202 of the second wafer 200. In some embodiments, the third width Pw3 is measured from a reference plane extending from the edge 206 to a reference plane extending from the trimmed edge 302. In some embodiments that the first wafer 100 and the second wafer are silicon wafers having a diameter of about 12-inch, the third width Pw3 ranges from about 2 mm to about 3 mm or is about 2.6 mm. In some embodiments, a total thickness of the second thickness Pt2 and the third thickness Pt3 ranges from 20 microns to 30 microns or is about 25 microns. For example, the third thickness Pt3 may be greater than the second thickness Pt2. It should be noted that the dimension of the annular ring TR2 and TR3 may be modified according to the dimension of the wafer and the design requirements of the product, which is not limited thereto.

Referring to FIG. 3D, after performing the second marking-trimming step, similar with the edge surface of the trimmed edge 106a shown in FIG. 2D, the edge surface of the trimmed edge 302 may have may have a plurality of first regions R3 surrounding by the second regions R4. In some embodiments, the first regions R3 are formed from the recesses 70a (FIG. 3B) cutting through during the trimming step. The individual first regions R3 may be spaced apart from one another by the second region R4 surrounding them. Similarly, as the second pre-trimming mark is formed prior to the second trimming step, a smaller main crack portion C1 is formed due to the less localized stress concentration. The texture features TF3 of the first regions R3 is different from the texture feature TF4 of the second region R4 exhibited on the edge surface of the trimmed edge 302 of the stacked wafer structure 300, which is described above. The detailed descriptions are omitted herein.

Figure 1H:
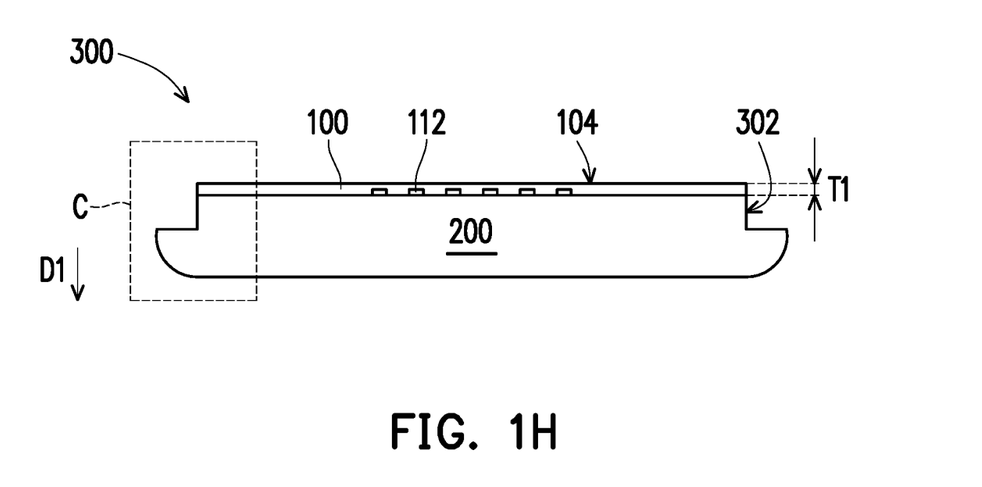

Referring to FIG. 1H, after performing the second marking-trimming step, the thickness of the stacked wafer structure 300 may be further reduced by, for example, performing a grinding process, a chemical mechanical polishing (CMP) process, or other suitable polishing process. In some embodiments, the first wafer 100 is thinned from the second surface 104 along the thickness direction D1 in a state in which the second wafer 200 carries the first wafer 100 after the second marking-trimming step. This thinning process brings the first wafer 100 to a desired thickness T1. For example, the thickness T1 of the first wafer 100 is approximately 2.6 μm. In some embodiments, cleaning of the stacked wafer structure 300 may be carried out after thinning process by means of wet cleaning with a liquid medium, such as tetramethylammonium hydroxide (TMAH), which may selectively remove the surface contaminants and particulates without attacking or chemically altering the second surface 104 of the first wafer 100. Thereafter, the trimming method of the stacked wafer structure is substantially completed as shown in FIG. 1H.

Figure 4A:
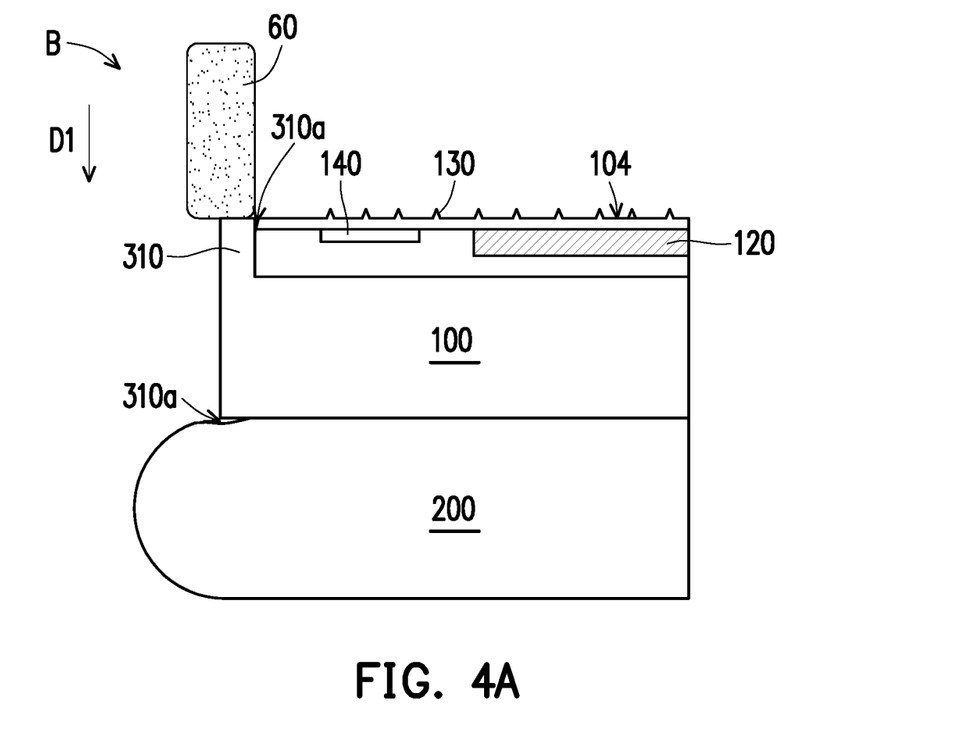
FIG. 4A illustrates a schematic enlarged cross-sectional view of the area B indicated in FIG. 1F before performing the second trimming step, in accordance with some embodiments of the present disclosure.
Figure 4B:
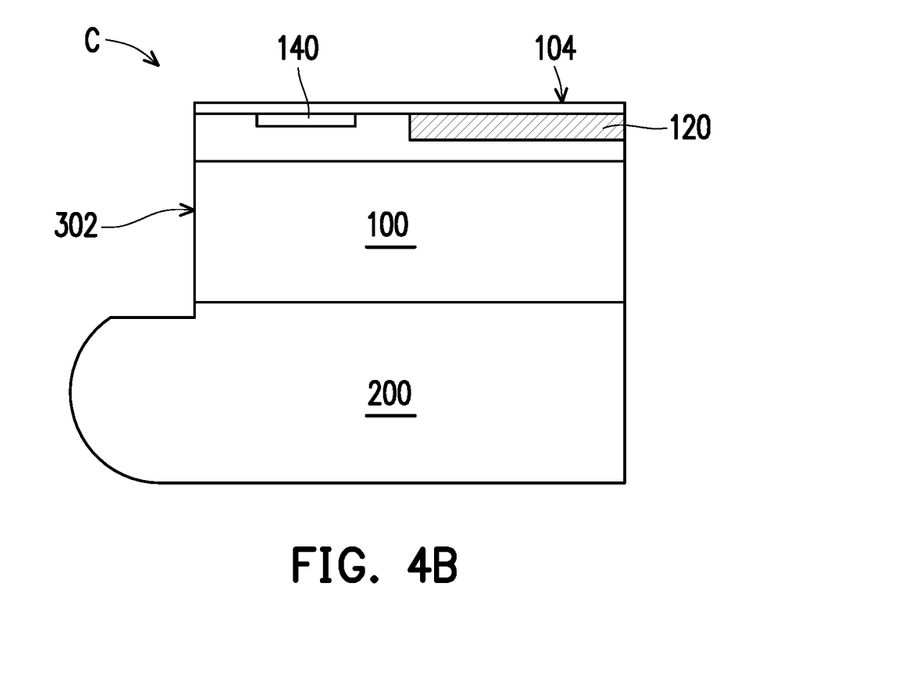
FIG. 4B illustrates a schematic enlarged cross-sectional view of the area C indicated in FIG. 1H, in accordance with some embodiments of the present disclosure.

FIG. 4A illustrates a schematic enlarged cross-sectional view of the area B indicated in FIG. 1F before performing the second trimming step, in accordance with some embodiments. FIG. 4B illustrates a schematic enlarged cross-sectional view of the area C indicated in FIG. 1H, after performing the second trimming step in accordance with some embodiments. Referring to FIG. 4A and FIG. 4B, the first wafer 100 may include a backside alignment mark 140 at the backside under the second surface 104 of the first wafer 100. For example, the first wafer 100 and the second wafer 200 may be aligned by using the backside alignment mark 140 for better alignment during bonding the first wafer 100 and the second wafer 200. In some embodiments, when the first wafer 100 is thinned, the trimmed edge 106a of the first wafer 100 is susceptible to chipping and cracking. In other words, after thinning the first wafer 100 as illustrated in FIG. 1E and/or FIG. 1F, an edge portion 310 may include defects 310a presented at the periphery of the stacked wafer structure 300. The defects 310a may be edge peeling defect, cracks, edge chipping defect or the like. Such defects 310a may facilitate contaminant incursion during subsequent processes and may damage or destroy the functionality of the circuitry layer 120 of the first wafer 100. That is, if the edge portion 310 having the defects 310a is not trimmed off, the manufacturing yield may be adversely affected. Accordingly, the second trimming step is performed to trim off the edge portion 310 from the stacked wafer structure 300 to from the trimmed edge 302 without affecting the circuitry layer 120, thereby reducing potential edge-peeling or chipping issue and preventing the loss in the manufacturing yield. For example, by performing the second trimming step, the edge-chipping issue may be reduced to 5% to 20% approximately compared to the process without performing the second trimming step.

In some embodiments, after thinning the first wafer 100 as shown in FIG. 1F, the microscopic protrusions 130 may be presented on the second surface 104 which went through thinning. In other words, thinning the first wafer 100 (as illustrate in FIG. 1E and FIG. 1F) does not necessarily planarize or polish the second surface 104 to a high degree. Such microscopic protrusions 130 on the second surface 104 may be critical for the very thin wafer(s). Accordingly, the planarizing process, such as CMP, may be performed to remove the microscopic protrusions 130 to form the substantially planar second surface 104 as shown in FIG. 4B.

Based on the above, since the pre-trimming mark is formed before trimming, the contact between the trimming tool and the wafer is reduced on the trimming path, thereby reducing localized stress concentration at the surface of the wafer. Accordingly, the operation efficiency of trimming is improved and the damage of the trimming tool may be reduced so as to lengthen the service life thereof. Moreover, by performing the first trimming step, the edge cracking issue due to sharp edges of the thinned wafer can be eliminated. In addition, by performing the second trimming step, the edge chipping or peeling issue is reduced and also the loss in the manufacturing yield is prevented.

According to some embodiments, a trimming method is provided. The trimming method includes the following steps. A first wafer having a first surface and a second surface opposite to the first surface is provided. A first pre-trimming mark is formed on the first surface of the first wafer, wherein forming the first pre-trimming mark comprises forming a plurality of recesses arranged as a path along a periphery of the first wafer. The first wafer is trimmed on the first pre-trimming mark and along the path of the first pre-trimming mark to remove a portion of the first wafer and form a trimmed edge having first regions thereon.

According to some alternative embodiments, a trimming method is provided. The trimming method includes the following steps. A first wafer having a first surface and a second surface opposite to the first surface is provided. A first marking-trimming step is performed to the first wafer from the first surface of the first wafer along a thickness direction to remove an annular ring around a periphery of the first wafer. A stacked wafer structure is formed by providing and stacking a second wafer to the first surface of the first wafer. A second marking-trimming step is performed to the stacked wafer structure from the second surface of the first wafer along the thickness direction to remove an edge portion of the stacked wafer structure.

According to some alternative embodiments, a wafer structure is provided. A wafer has a first surface, a second surface opposite to the first surface and an edge connecting the first surface and the second surface. The edge is substantially perpendicular to the first surface and the second surface of the wafer, the edge has first regions surrounding by a second region, the individual first regions are separated and spaced from one another by the second region, and a texture feature of the second region is different from texture features of the first regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A trimming method, comprising:
providing a first wafer having a first surface and a second surface opposite to the first surface;
performing a first marking-trimming step to the first wafer from the first surface of the first wafer along a thickness direction to remove an annular ring around a periphery of the first wafer;
forming a stacked wafer structure by providing and stacking a second wafer to the first surface of the first wafer; and
performing a second marking-trimming step to the stacked wafer structure from the second surface of the first wafer along the thickness direction to remove an edge portion of the stacked wafer structure.

2. The trimming method according to claim 1, wherein performing the first marking-trimming step to the first wafer comprises:
forming a first pre-trimming mark on the first surface of the first wafer, wherein the first pre-trimming mark is formed by forming a plurality of recesses spaced from one another and distributed in a circular path along the periphery of the first wafer.

3. The trimming method according to claim 2, wherein forming the first pre-trimming mark comprises:
performing an etching process to the first surface of the first wafer to form a plurality of recesses.

4. The trimming method according to claim 2, wherein forming the first pre-trimming mark comprises:
performing a laser marking process to the first surface of the first wafer to form a plurality of recesses.

5. The trimming method according to claim 2, wherein performing the first marking-trimming step to the first wafer further comprises:
trimming the first wafer by cutting on the first pre-trimming mark and cutting into the first wafer along the circular path of the first pre-trimming mark to remove the annular ring.

6. The trimming method according to claim 1, wherein forming the stacked wafer structure comprises:
bonding the first wafer and the second wafer to form the stacked wafer structure, wherein the first surface of the first wafer directly bonds with the second wafer.

7. The trimming method according to claim 6, further comprising:
thinning the first wafer from the second surface of the first wafer after bonding the first wafer and the second wafer.

8. The trimming method according to claim 1, wherein performing the second marking-trimming step to the stacked wafer structure comprises:
forming a second pre-trimming mark on the second surface of the first wafer; and
trimming the stacked wafer structure by cutting on the second pre-trimming mark and cutting into the first wafer and the second wafer along the second pre-trimming mark to remove the edge portion of the stacked wafer structure.

9. A method comprising:
bonding a first surface of a first wafer to a second wafer, wherein a plurality of semiconductor devices is distributed on the first surface of the first wafer;
performing a first thinning process on a second surface of the first wafer which is opposite to the first surface;
forming a pre-trimming mark on the thinned second surface of the first wafer, wherein the pre-trimming mark comprises a plurality of recesses arranged as a path along a periphery of the first wafer;
performing a trimming process along the pre-trimming mark on the first wafer comprising:
moving a trimming tool along the path arranged by the plurality of recesses to shorten a trimming distance of the trimming tool on the first wafer; and
performing a second thinning process on the thinned second surface of the first wafer to a predetermined thickness after the trimming process.

10. The method according to claim 9, wherein forming the pre-trimming mark comprises:
forming the plurality of recesses as individual trenches without filling material formed in the individual trenches.

11. The method according to claim 9, wherein forming the pre-trimming mark comprises:
forming the plurality of recesses as individual trenches spaced apart from one another, wherein a pitch between two of the adjacent individual trenches substantially ranges from 5 μm to 100 μm.

12. The method according to claim 11, wherein a ratio of a sum of the pitches between the individual trenches to a total length of the path arranged by the plurality of recesses substantially ranges from 30% to 80%.

13. The method according to claim 9, further comprising:
forming a preliminary trimming mark on the first surface of the first wafer, wherein the preliminary trimming mark formed as a trimming path along an edge of the first surface of the first wafer; and
performing a preliminary trimming process along the preliminary trimming mark before bonding the first wafer to the second wafer.

14. The method according to claim 13, wherein forming the preliminary trimming mark comprises:
forming a plurality of preliminary recesses as individual trenches without filling material formed in the individual trenches.

15. The method according to claim 9, wherein when performing the trimming process along the pre-trimming mark on the first wafer, a peripheral portion of the second wafer is removed.

16. The method according to claim 9, wherein:
   forming the plurality of recesses by etching or laser marking, and
   forming a trimmed edge of the first wafer by performing the trimming process along the pre-trimming mark, wherein the trimmed edge comprises a plurality of first regions and a second region surrounding the plurality of first regions, and a plurality of streaks in the respective first region extends in a thickness direction of the first wafer.

17. The method according to claim 16, wherein the second region of the trimmed edge comprises a first crack portion close to the thinned second surface of the first wafer and a second crack portion below the first crack portion, and a thickness of the first crack portion is less than a thickness of the second crack portion.

18. The method according to claim 17, wherein a plurality of curved streaks substantially parallel to one another is formed in the second crack portion of the second region of the trimmed edge.

\* \* \* \* \*